(12) United States Patent
Valois

(10) Patent No.: US 7,523,526 B1
(45) Date of Patent: Apr. 28, 2009

(54) FLUSH SURFACE MOUNTING CLIP AND ITS ASSOCIATED METHOD OF CONSTRUCTION

(76) Inventor: A. Daniel Valois, 3552 W. Lizard Creek Rd., Lehighton, PA (US) 18235

( * ) Notice: Subject to any disclaimer, the term of this patent is extended or adjusted under 35 U.S.C. 154(b) by 239 days.

(21) Appl. No.: 11/345,596

(22) Filed: Feb. 2, 2006

(51) Int. Cl.
*A44B 21/00* (2006.01)

(52) U.S. Cl. ........................................ 24/3.11

(58) Field of Classification Search ............... 24/3.11, 24/3.12; 224/668, 269, 272, 271
See application file for complete search history.

(56) References Cited

U.S. PATENT DOCUMENTS

| | | | |
|---|---|---|---|
| 4,111,343 A | 9/1978 | Selinko | 224/5 |
| 4,584,250 A * | 4/1986 | Hooke et al. | 429/97 |
| 6,233,789 B1 * | 5/2001 | Douglas | 24/3.12 |
| 6,421,885 B1 * | 7/2002 | Mowers et al. | 24/3.12 |
| 6,481,058 B1 | 11/2002 | Moster et al. | 24/3.11 |
| 7,063,244 B2 * | 6/2006 | Lee et al. | 224/271 |

* cited by examiner

*Primary Examiner*—James R Brittain
(74) *Attorney, Agent, or Firm*—LaMorte & Associates

(57) ABSTRACT

A mounting clip assembly for a portable consumer product. The mounting clip assembly has a clip body with a top surface and two ends. A hole is provided in a housing wall of the consumer product. The hole is sized to receive the clip body, wherein the clip body lays flush across the hole. A pivot pin extends across the hole. The pivot pin engages the clip body at a fulcrum point. A leaf spring is provided under the clip body. The leaf spring abuts against the clip body and applies a bias force that retains the clip body in a flush orientation with the top surface of the clip body. When a depression force is applied to one end of the clip body, the clip body pivots and causes the opposite end of the clip body to rise away from the exterior surface of the housing wall.

4 Claims, 5 Drawing Sheets

FLUSH SURFACE MOUNTING CLIP AND ITS ASSOCIATED METHOD OF CONSTRUCTION

BACKGROUND OF THE INVENTION

1. Field of the Invention

In general, the present invention relates to mounting clips of the type that connect small objects to belts, waistbands and pocket hems. More particularly, the present invention relates to mounting clips that lay flush within the surface of an object until the mounting clip needs to be used.

2. Prior Art Description

There are many consumer goods that are commonly manufactured with clips. Consumer goods, such as cellular telephones, knives, beepers, MP3 players and the like, often have mounting clips attached to their external housings. The presence of the clip allows the consumer good to be attached to a belt, waistband, pocket hem, purse strap or another such area. Although mounting clips are highly useful features, they do present a problem to manufacturers of small consumer goods. Many people prefer to carry objects, such as cellular telephones, in their pocket or purse, rather than utilize a clip. For such people, the smaller the object is, the easier it is to carry. Thus, cellular phones, MP3 players and other such items having the thinnest profiles are the most appealing to such consumers.

If a mounting clip is attached to a thin cellular phone, knife or other such object, the presence of the mounting clip may double the thickness of the object. Consequently, an object with a mounting clip is harder to carry inside a pocket than that same object without the mounting clip. Thus, if a manufacturer adds a mounting clip to a consumer product, it may lose its appeal to many customers. Conversely, if a manufacturer makes a product without a mounting clip, that product many lose its appeal to the many other customers who desire a mounting clip.

The problem of whether or not to provide a mounting clip is sometimes addressed by the use of different holsters. Often a product, such as a cellular phone or a knife, is sold in a holster. The holster includes a mounting clip as part of its structure. If a person wants a mounting clip, they use the holster. If they do not want the mounting clip, they remove the product from the holster. However, many people do not like the look of a holster and the holster adds significantly to the cost of a product.

Another solution to the problem of a mounting clip is to build the mounting clip into the structure of the consumer product in a manner that enables the mounting clip to be selectively retracted and extended. Mounting clips have been designed that lay flush against the surface upon which they are present. Such flush mounting clips are exemplified by U.S. Pat. No. 4,111,343 to Selinko, entitled Retractable Mounting Clip Arrangement For Miniature Portable Apparatus Or The Like; and U.S. Pat. No. 6,481,058 to Muster, entitled Accessory For A Portable Apparatus. Such prior art mounting clip configurations require that deep reliefs be formed in the surface of the object under the mounting clip. The deep reliefs are designed to hold the body of the mounting clip, springs, magnets and other components. Such mounting clip configurations, therefore, have only limited applicability. Many consumer products, such as cellular telephones, MP3 players and the like, have housings that are made from only a thin layer of plastic. Such surfaces do not have the depth, or strength to hold prior art flush mounting clip designs. However it is these very products that would benefit the most from a flush mounting clip.

A need therefore exists for a mounting clip configuration that can be mounted flush upon a surface of a product, even if that surface is thin and unsupported. This need is met by the present invention as described and claimed below.

SUMMARY OF THE INVENTION

The present invention is a mounting clip assembly for a portable consumer product. The mounting clip assembly has a clip body with a top surface, a bottom surface, a first end and a second end. A hole is provided in a housing wall of the consumer product. The hole is sized to receive the clip body, wherein the clip body lays flush across the hole.

A pivot pin is provided that extends across the hole in the housing wall. The pivot pin engages the clip body at a fulcrum point between the first end and the second end of the clip body.

A leaf spring is provided under the clip body. The leaf spring has an anchored end and an opposite free floating end. The free floating end of the leaf spring abuts against the clip body and applies a bias force to the clip body that retains the clip body in a flush orientation. In the flush orientation, the top surface of the clip body lays generally flush with the exterior surface of the housing wall. When a depression force is applied to the first end of the clip body that exceeds the biasing force of the leaf spring, the clip body pivots about the fulcrum point and causes the second end of the clip body to rise away from the exterior surface of the housing wall. The rising second end of the clip body is used as a mechanical clamp to attach the consumer product to any object that can fit between the second end of the clip body and the housing of the consumer product.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE DRAWINGS

The present invention mounting clip configuration can be manufactured as part of many portable consumer products, such as cellular telephones, MP3 players, beepers, pocket knives and the like. It will therefore be understood that the present invention is the structure of the mounting clip and any consumer product bearing such a mounting clip construction is intended to be included in the scope of this patent.

Figure 1:
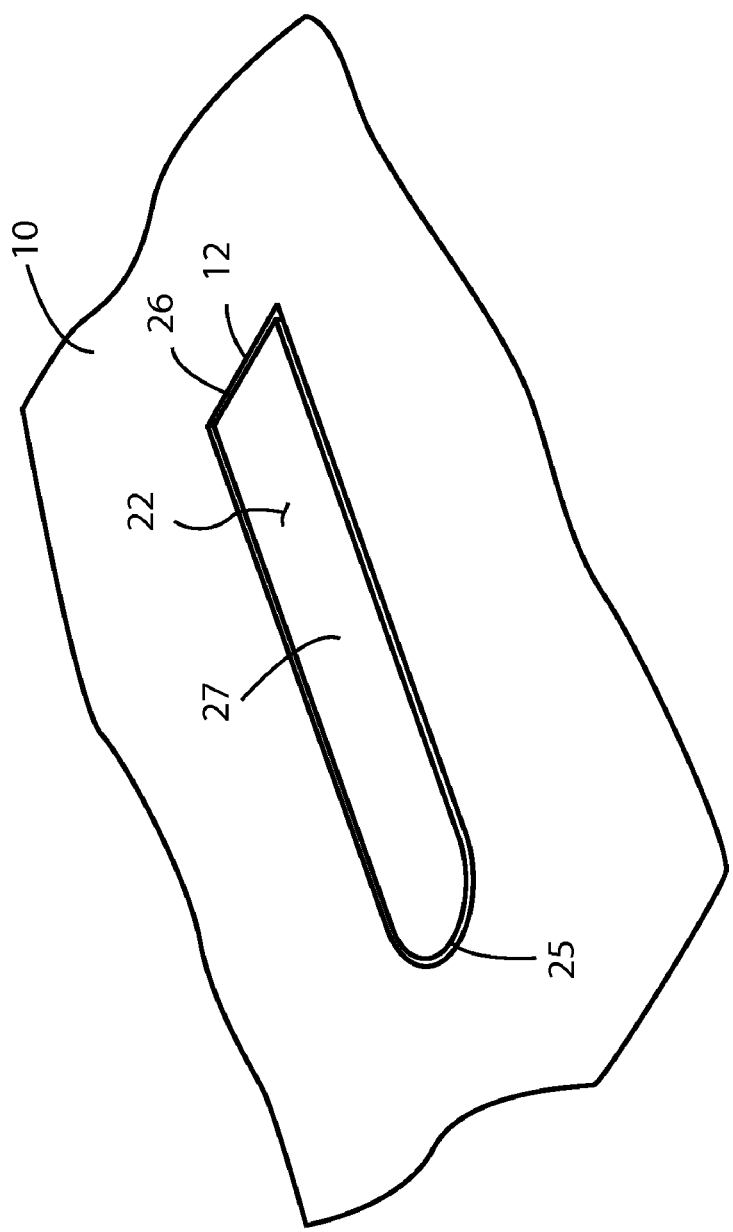
FIG. 1 is a perspective view of a clip assembly on a segment of a product housing.
Figure 2:
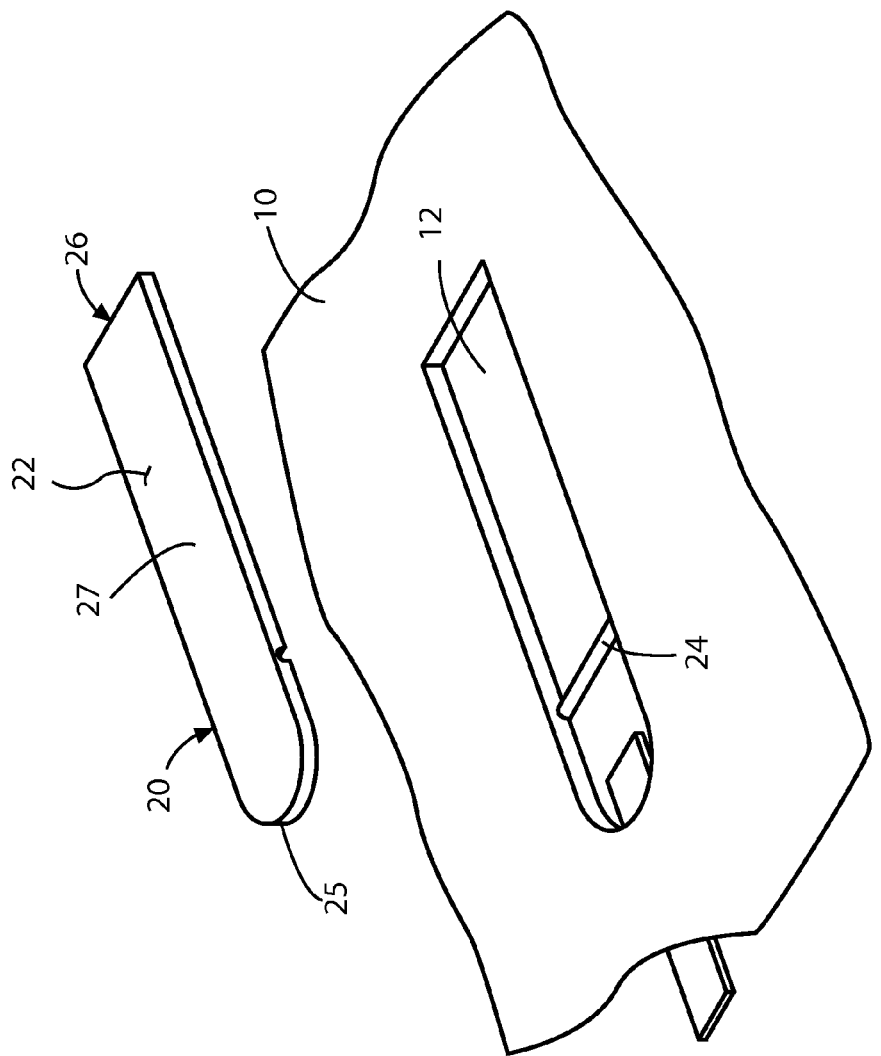
FIG. 2 is an exploded view of the embodiment shown in FIG. 1.

Referring to FIG. 1 in conjunction with FIG. 2, there is shown a segment of a thin wall housing 10. The thin wall housing 10 can be a segment of the housing of many small consumer products, such as cellular telephones, MP3 players, pocket knives and such objects that traditionally may bear a mounting clip. In the thin wall housing 10 is formed a mounting clip hole 12. The mounting clip hole 12 extends cleanly through the material of the thin wall housing 10.

A clip body 20 is provided. The clip body 20 has a flat top surface 22. The flat top surface 22 has the same peripheral shape as does the mounting clip hole 12 in the thin wall housing 10. The clip body 20 lays in the mounting clip hole 12 so that the top surface 22 of the clip body 20 lays flush with the exterior surface 23 of the thin wall housing 10. Consequently, when the clip body 20 is laying flush in the mounting clip hole 12, the top surface 22 of clip body 20 fills the mounting clip hole 12 completely.

A pivot post 24 is provided under the clip body 20. The pivot post 24 attaches to the thin wall housing 10 below the mounting clip hole 12. The clip body 20 teeters atop the pivot post 24. The pivot post 24, however, does not align with the center of the clip body 20. Rather, if the clip body 20 is considered to have a first end 25, a second end 26 and a midpoint 27, the pivot post 24 engages the clip body 20 between the midpoint 27 and the first end 25.

Figure 3:
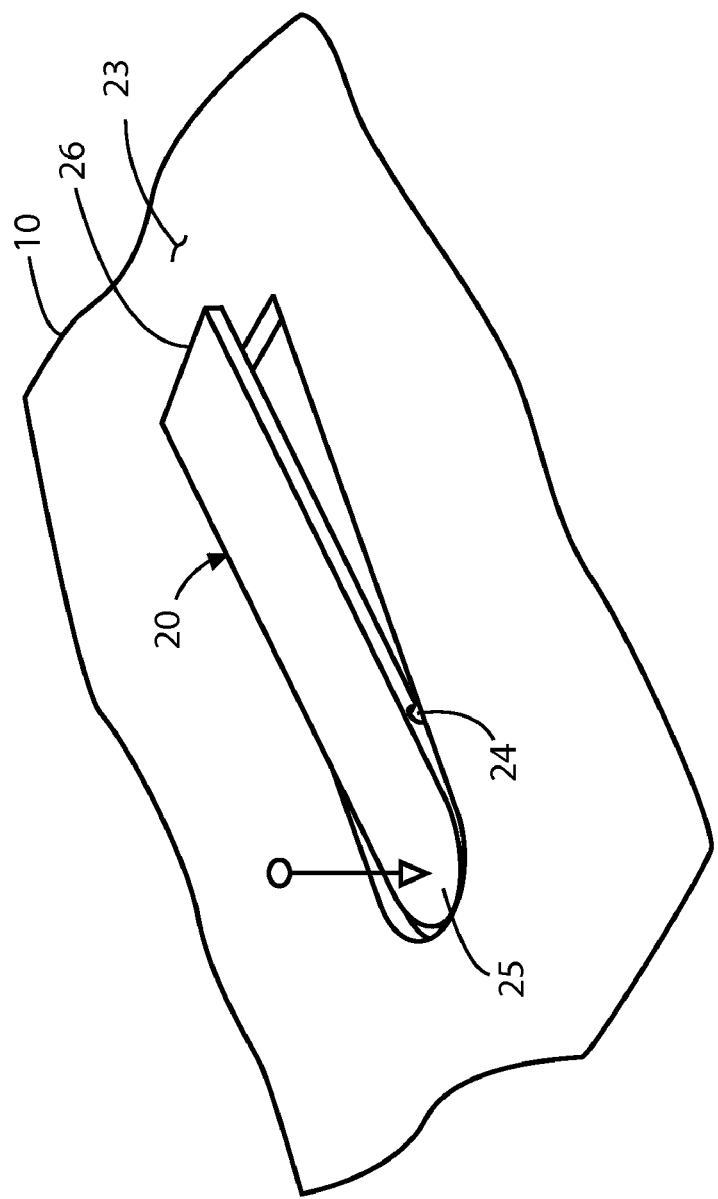
FIG. 3 is a perspective view of the embodiment of FIG. 1 shown in an open condition.

Referring briefly to FIG. 3, in conjunction with FIG. 2, it can be seen that when a downward force is applied to the first end 25 of the clip body 20, the clip body 20 teeters about the pivot post 24. This causes the second end 26 of the clip body 20 to rise above the plane of the thin wall housing 10. As the second end 26 of the clip body 20 rises, a gap occurs between the clip body 20 and the thin wall housing 10. A belt, purse strap or waistband can be set into this gap, thereby enabling the clip body 20 and thin wall housing 10 to form a grasping mechanical clip.

The clip body 20 is biased into a flush orientation where the top surface 22 of the clip body 20 lays flush in the same plane as the exterior surface 23 of the thin wall housing 10. Thus, when the first end 25 of the clip body 20 is depressed and the second end 26 rises, there is a biasing force that acts to move the second end 26 back into its flush orientation. The second end 26 of the clip body 20 therefore clamps down upon any object placed between the second end 26 of the clip body 20 and the exterior surface of the thin wall housing 10.

Figure 4:
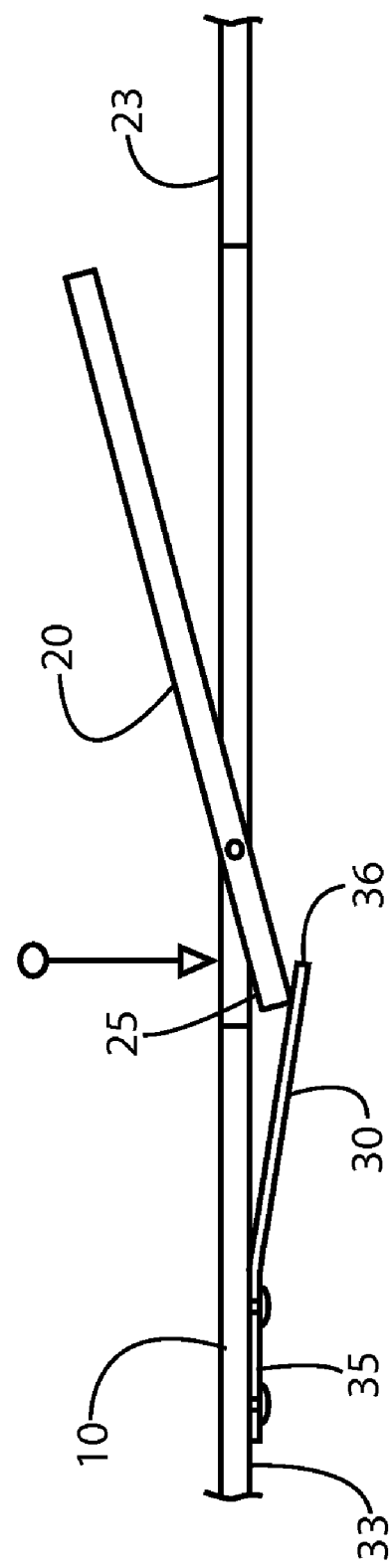
FIG. 4 is a cross-sectional view of the embodiment of FIG. 1.

Referring to FIG. 4, it can be seen that a leaf spring 30 is attached to the interior surface 33 of the thin wall housing 10. The leaf spring 30 has a first end 35 and a second end 36. The first end 35 of the leaf spring 30 is affixed to the thin wall housing 10. The leaf spring 30 can be attached using a mechanical interconnection and/or adhesive. The area of the leaf spring 30 proximate its second end 36 is free floating and is not attached to the thin wall housing 10.

The second end 36 of the leaf spring 30 extends under the first end 25 of the clip body 20. When the leaf spring 30 is not stressed, it positions the clip body 20 so that the clip body 20 lays flush with the exterior surface 23 of the thin wall housing 10.

From FIG. 4, it can be seen that when a depression force is applied to the first end 25 of the clip body 20, the underlying leaf spring 30 yields. As the second end 36 of the leaf spring 30 yields, the clip body 20 teeters upon the pivot pin 24. The first end 25 of the clip body 20 goes down and the second end 26 of the clip body 20 rises up. The leaf spring 30 remains in contact with the first end 25 of the clip body 20 as it is depressed. The leaf spring 30 provides an upward bias to the underside of the clip body's first end 25. This upward bias is transferred to the second end 26 of the clip body 20 through the fulcrum of the pivot post 24. The second end 26 of the clip body 20 is therefore provided with a downward clamping force.

In the illustrations, the leaf spring 30 is shown being linearly aligned with the clip body 20. It will be understood that such an embodiment is merely exemplary. The leaf spring 30 can have any orientation with respect to the clip body 20. The orientation of the leaf spring 30 is of no importance. What does matter is that the free floating end of the leaf spring 30 terminates under the first end 25 of the clip body 20 so as to provide an upward bias to that end of the clip body 20.

Figure 5:
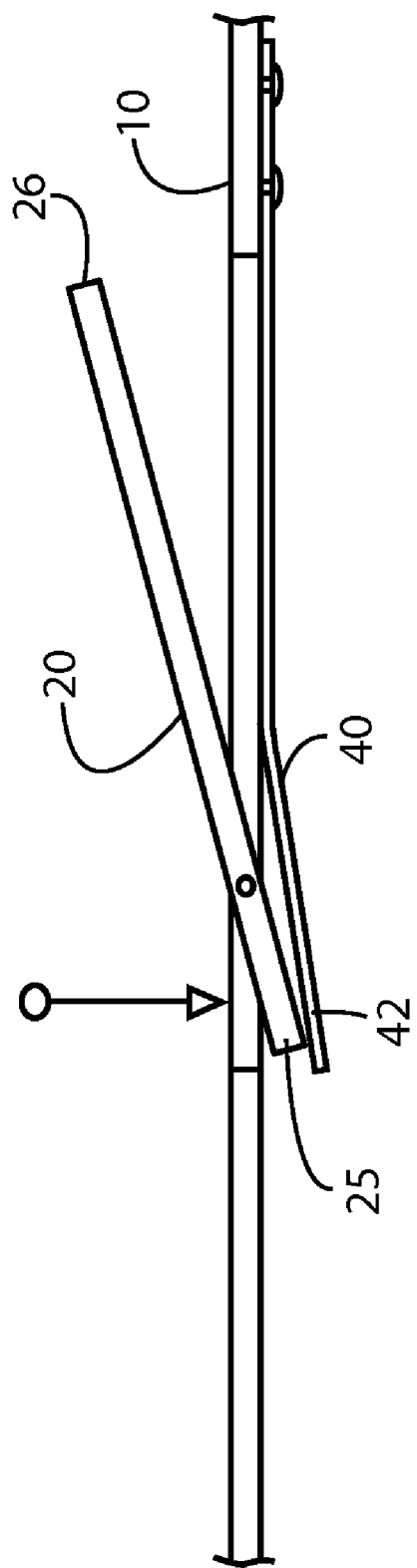
FIG. 5 is a cross-sectional view of the embodiment of FIG. 3.

Referring to FIG. 5, one such alternate configuration is shown. In the embodiment of FIG. 5, a leaf spring 40 is affixed to the thin wall housing 10 near the second end 26 of the clip body 20. The leaf spring 40 extends under the clip body 20, wherein the free floating end 42 of the leaf spring 40 is positioned under the first end 25 of the clip body 20. This configuration requires less space than does the earlier embodiment of FIG. 4. However, the functionality of the overall assembly remains the same.

It will be understood that the embodiments of the present invention are merely exemplary and that a person skilled in the art can make alternate embodiments using functionally equivalent components that have not been described. For example, the leaf spring can be replaced with a cantilevered segment of plastic that is molded as part of the thin walled housing. Furthermore, the clip body and the thin wall housing need not be straight. Rather both the clip body and the thin wall housing can have matching complex curvatures. All such variations, modifications and alternate embodiments are intended to be included within the scope of the present invention as defined by the claims.

What is claimed is:

1. In a portable consumer product having a housing wall with an interior surface and an exterior surface, an integral mounting clip assembly, comprising:
   a clip body having a top surface, a bottom surface, a first end and a second end;
   a hole defined in the housing wall, wherein said hole is sized to receive said clip body flush therein;
   a pivot pin extending across said hole, wherein said pivot pin engages said clip body at a fulcrum point between said first end and said second end of said clip body;
   a leaf spring having an anchored end that is anchored to said housing wall and a free floating end, wherein said free floating end abuts against said clip body and applies a bias force to said clip body that retains said clip body in a flush orientation where said top surface of said clip body lays generally flush with said exterior surface of said housing wall; and
   wherein said clip body pivots about said fulcrum point, causing said second end of said clip body to rise away from said exterior surface of said housing wall when a depression force is applied to said first end of said clip body that exceeds said biasing force of said leaf spring.

2. The product according to claim 1, wherein said top surface of said clip body has a peripheral shape and said hole has a corresponding peripheral shape so that said top surface of said clip body fills said hole when said clip body is in said flush orientation.

3. The product according to claim 1, wherein said clip body has a midpoint, and wherein said fulcrum point occurs between said first end of said clip body and said midpoint.

4. The product according to claim 1, wherein said leaf spring is anchored to said interior surface of said housing wall.

* * * * *